(12) United States Patent
Huat et al.

(10) Patent No.: US 6,867,483 B2
(45) Date of Patent: Mar. 15, 2005

(54) STRESS-FREE LEAD FRAME

(75) Inventors: Lee Kock Huat, Ipoh (MY); Chan Boon Meng, Ipoh (MY); Cheong Mun Tuck, Ipoh (MY); Lee Huan Sin, Melaka (MY); Phuah Kian Keung, Ipoh (MY); Araventhan Eturajulu, Ipoh (MY); Liow Eng Keng, Ipoh (MY); Thum Min Kong, Perak (MY); Chen Choon Hing, Perak (MY)

(73) Assignee: Carsen Semiconductor SDN. BHD. (MY)

( * ) Notice: Subject to any disclaimer, the term of this patent is extended or adjusted under 35 U.S.C. 154(b) by 0 days.

(21) Appl. No.: 09/909,934

(22) Filed: Jul. 20, 2001

(65) Prior Publication Data

US 2002/0105063 A1 Aug. 8, 2002

(30) Foreign Application Priority Data

Sep. 13, 2000 (MY) .................................... PI 20004237

(51) Int. Cl.$^7$ ............................................. H01L 23/04
(52) U.S. Cl. ..................................................... 257/669
(58) Field of Search ................................. 257/669, 667, 257/723, 666, 674, 670; 361/760, 813; 174/52.1, 52.2

(56) References Cited

U.S. PATENT DOCUMENTS

| | | | | |
|---|---|---|---|---|
| 3,778,887 A | * | 12/1973 | Suzuki et al. .................. | 29/827 |
| 5,122,860 A | | 6/1992 | Kikuchi et al. | |
| 5,134,773 A | | 8/1992 | LeMaire et al. | |
| 5,172,214 A | | 12/1992 | Casto | |
| 5,417,905 A | | 5/1995 | Lemaire et al. | |
| 5,637,913 A | * | 6/1997 | Kajijara et al. .............. | 257/666 |
| 5,854,740 A | * | 12/1998 | Cha ............................ | 361/760 |
| 5,854,741 A | * | 12/1998 | Shim et al. .................. | 361/813 |
| 5,869,353 A | * | 2/1999 | Levy et al. .................. | 438/109 |
| 5,942,794 A | | 8/1999 | Okumura et al. | |
| 6,043,109 A | * | 3/2000 | Yang et al. .................. | 438/113 |
| 6,091,134 A | * | 7/2000 | Sakamoto et al. ........... | 257/666 |
| 6,130,473 A | | 10/2000 | Mostafazadeh et al. | |
| 6,137,160 A | * | 10/2000 | Ishikawa ..................... | 257/676 |
| 6,143,981 A | | 11/2000 | Glenn | |
| 6,229,200 B1 | | 5/2001 | Mclellan et al. | |
| 6,242,281 B1 | | 6/2001 | Mclellan et al. | |
| 6,281,568 B1 | | 8/2001 | Glenn et al. | |
| 6,215,177 B1 | * | 4/2002 | Corisis et al. .............. | 257/666 |
| 6,377,742 B1 | * | 4/2002 | Go ............................. | 385/134 |
| RE37,690 E | * | 5/2002 | Kitano et al. ............... | 257/666 |
| 6,433,277 B1 | | 8/2002 | Glenn | |
| 6,455,356 B1 | | 9/2002 | Glenn et al. | |
| 6,483,177 B1 | * | 11/2002 | Yee ............................. | 257/670 |
| 6,521,987 B1 | | 2/2003 | Glenn et al. | |
| 6,563,201 B1 | * | 5/2003 | Golz ........................... | 257/672 |
| 6,630,728 B2 | | 10/2003 | Glenn | |
| 6,684,496 B2 | | 2/2004 | Glenn | |

FOREIGN PATENT DOCUMENTS

| | | | | |
|---|---|---|---|---|
| DE | 100 14 306 A1 | * | 3/2000 | ................ 257/672 |
| JP | 63-033854 | | 2/1988 | |
| JP | 63-188964 | | 8/1988 | |
| JP | 63-289951 | | 11/1988 | |
| JP | 01 106456 A | | 4/1989 | |
| JP | 02-129948 A | | 5/1990 | |
| JP | 3-69248 | | 7/1991 | |
| JP | 06-092076 A | | 4/1994 | |

* cited by examiner

*Primary Examiner*—David A. Zarneke
(74) *Attorney, Agent, or Firm*—Townsend and Townsend and Crew LLP

(57) ABSTRACT

The present invention relates to a stress-free lead frame (1) for a semiconductor. The stress-free lead frame (1) is provided with a stress-relief means (15) and an interlocking means (16) at the outer periphery. The stress-relief means (15) is capable of accommodating expansion and compression while the interlocking means (16) take care of shock and vibration during handling to thereby eliminate delamination of the lead frame (10).

14 Claims, 2 Drawing Sheets

STRESS-FREE LEAD FRAME

RELATED APPLICATIONS

Figure 1:
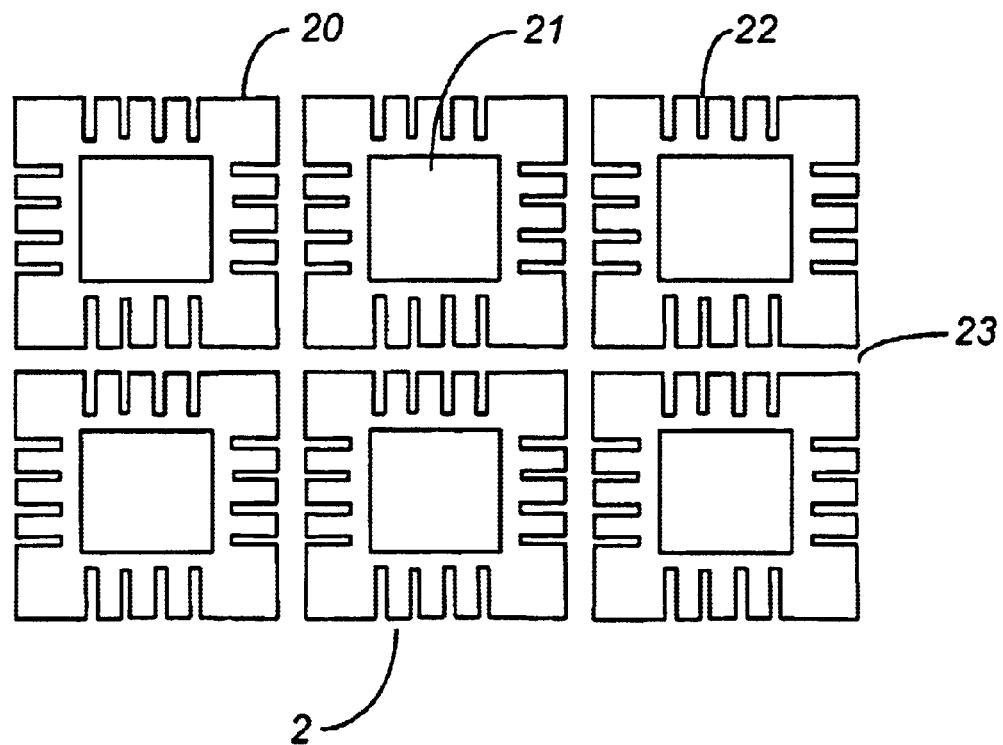

This application claims priority under 35 U.S.C. §119 from Malaysian patent application serial number PI 20004237, filed Sep. 13, 2000.

FIELD OF THE INVENTION

The present invention relates generally to a lead frame, especially to a stress-free lead frame for semiconductor provided with a stress-relief means and an interlocking means for eliminating delamination of leads during packaging.

BACKGROUND ART OF THE INVENTION

The process of manufacturing semiconductor devices involves several steps whereby an integrated circuit chip is bonded to a foil-type lead frame and encapsulated in epoxy or other moulded resin. The lead frame comprises of a plurality of leads etched or stamped out of a thin metallic foil sheet, and the inner ends of the leads are usually bonded to the solder bumps of the integrated circuit chip by a thermal compression method. The chip is then encapsulated in plastic by a transfer moulding process that results in a chip package having the outer ends of the leads expose to the outside for connection to a circuit board.

In a typical prior art system for bonding and encapsulating integrated circuits, a plurality of such circuits is linearly arranged in a single workpiece, which contains a series of identical lead frames etched or stamped on a strip of metallic substrate. A chip is bonded to each of the pre-manufactured lead frames and they are loaded to a bottom mould with the number of lead frames in a single batch being determined by the mould size and the capacity of the moulding equipment being used. A top mould is moved into place atop the bottom mould and some means is provided within the moulding equipment to heat the moulds to a proper moulding temperature, and to subsequently cool them for curing purposes. The heated moulds are clamped together by the moulding equipment and when the temperature is right, usually at approximately 175° C., the moulding material such as epoxy in pellet form is placed in the mould set through pots formed either in the top or bottom mould. Plungers are then inserted into the pots of the mould and a pressurizing force is applied to the plungers. The combination of the pressurizing force and the heat causes the epoxy pellets to liquify and flow into cavities provided in the mould set, which determines the configuration and the location of the moulded plastic that encapsulate the integrated circuits. Upon completion of this step, the mould set is cooled to induce curing to the epoxy, then the plungers are pulled from the mould set, the mould set is unclamped, and the top mould is lifted from the bottom mould. The lead frames are then removed from the bottom mould and the next station may be trimming, forming, sawing and otherwise operations on them to finish fabrication of the electronic circuit packages. Typically the outer leads of each package need to be bent (formed) to conform to requirements of the printed circuit board for which they are designed.

Delamination, that is separation of the metal lead frame from the moulded epoxy has been reported to happen during handling of the MLP. This is undesirable as it will cause damage and thus render the MLP a reject.

The moulding step also subjects the lead frame to tremendous structural stresses caused by the difference in expansion and compression of the moulded metallic foil that the lead frame and the unmoulded metallic foil that is its outer periphery. This causes bending, waving and twisting of the leads, resulting in delamination of the leads or separation of the metallic lead frame and the epoxy which will results in reliability failure of the package.

Therefore there exists a need for an improved lead frame design that may eliminate delamination problem as mentioned above.

3. SUMMARY OF THE INVENTION

Accordingly, it is the primary object of the present invention to provide a stress-free lead frame having a stress-relief and an interlocking means for eliminating delamination of leads during packaging.

It is another object of the present invention to provide a stress-free lead frame having a stress-relief means that can be produced using existing moulding machine.

It is yet another object of the present invention to provide a stress-free lead frame having a stress-relief means that is of simple design for easy production.

These and other objects of the present invention are accomplished by,

A stress-free lead frame (1) comprising;

plurality of integrated circuit areas (11), each of said plurality of integrated circuit areas having a die pad (12) and a plurality of leads (13); and a peripheral pad (14) surrounding said plurality of integrated circuit areas, said peripheral pad (14) being provided with a plurality of stress-relief means (15).

4. BRIEF DESCRIPTION OF THE DRAWINGS

Other aspect of the present invention and their advantages will be discerned after studying the Detailed Description in conjunction with the accompanying drawings in which:

FIG. 1 showing a lead frame of the prior art having a multiple integrated circuit units.

Figure 2:
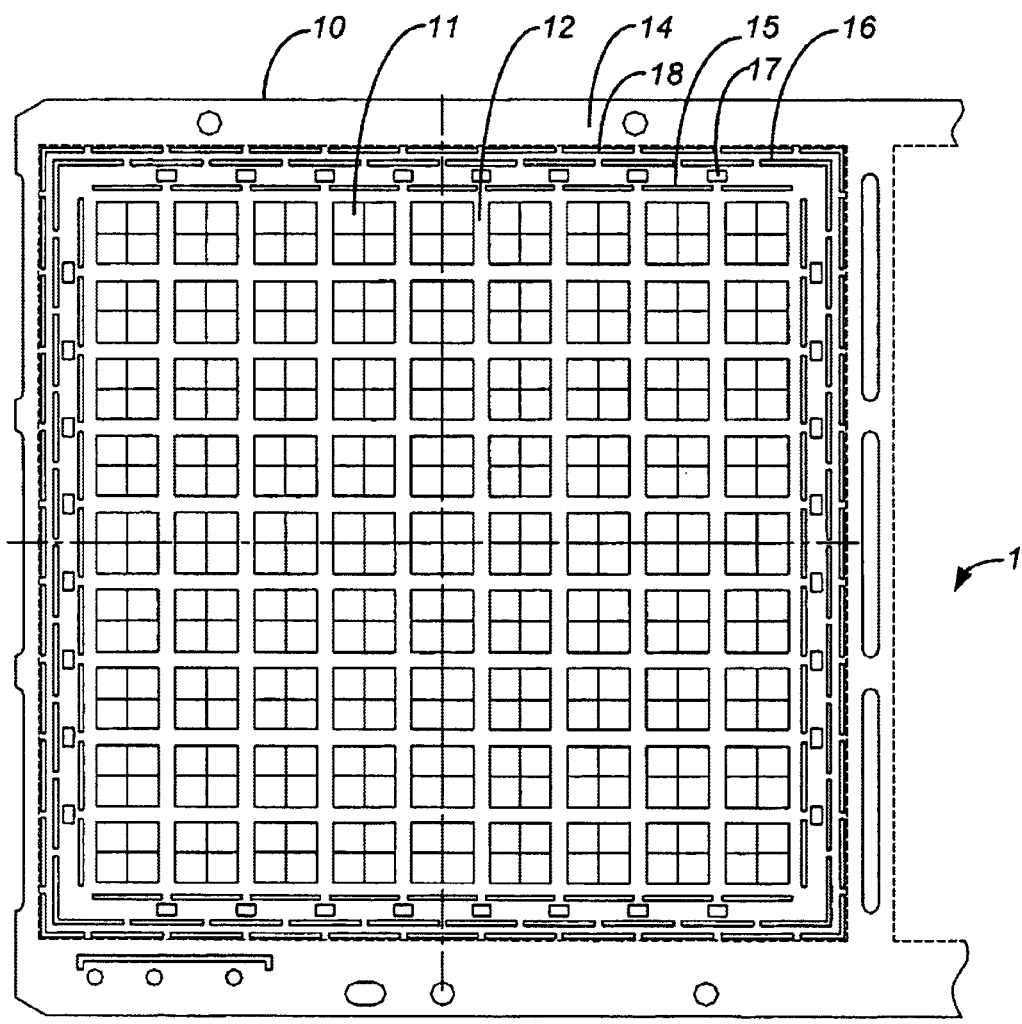

FIG. 2 showing a stress-free lead frame having a stress-relief means according to one embodiment of the present invention.

5. DETAILED DESCRIPTION OF THE DRAWINGS

Referring now to FIG. 1 showing a lead frame of the prior art having a multiple integrated circuit units. A lead frame (2) of the prior art consists of a plurality of integrated circuits (20), each having a die pad (21) and a plurality of leads (22) projecting outwardly from the die pad (21). The integrated circuits (20) are connected together by connecting bars (23). At the outer periphery of the lead frame (2), there is an inactive portion of the lead frame (2) called the peripheral pad (not shown). When the lead frame (2) is moulded to form the MLP, about half of the peripheral pad is left unmoulded causing different expansions and thus delamination to the plurality of leads (22) adjacent to the peripheral pad.

Referring to FIG. 2 showing a stress-free lead frame having a stress-relief means according to one embodiment of the present invention. The stress-free lead frame (1) comprises a lead frame (10) having a plurality of integrated circuit area or integrated circuits (11) joined together by connecting bars (12). Each of the integrated circuits (11) has a plurality of die pads (not shown) and leads (not shown)

projecting outwardly from the die pads. A peripheral pad (14) surrounds the lead frame (10).

The lead frame (10) is preferably of a metallic foil base, like copper or other suitable materials. Th. metallic foil is either etched or stamped to form the lead frame (10) that contain a plurality of integrated circuits (11). Each of the integrated circuit (11) has a die pad (not shown) for attaching a die and a plurality of leads (not shown) projecting away from the die pads. The lead frame (10) is surrounded by a peripheral pad (14) that is an inactive part of the metallic foil. The peripheral pad (14) is provided with a plurality of stress-relief means and a plurality of interlocking means in the form of holes and slots. Extensive research and experimentation has revealed that for best result, at least three rows of stress-relief means, a first row (15), a second row (17), and a third row (18), and a row of interlocking means (16) are needed. The first and the third row of the stress-relief means (15 and 18 respectively) are provided with slots, while the second row (17) is provided with holes, preferably square holes. The holes and slots are arranged side by side in equal intervals for equal expansion and compression distribution. For the interlocking means (16), a plurality of slots are arranged at equal intervals in between the second and the third row of the stress-relief means 17 and 18 respectively).

During moulding, the lead frame (10) and the peripheral pad (14) containing the stress-relief means (15) and the interlocking means (16) is moulded to form the MLP. The heat produced during this process causes the leads to expand and to compress when cooled. In prior art practice, this produces delamination that causes many of the resulting integrated circuits a reject. However, the provision of the stress-relief means (15) can easily accommodate the expansion and compression of the leads. Further, the interlocking means (16) holds firmly the lead frame (10) to the moulded epoxy thus eliminating altogether delamination in the leads caused either by expansion and contraction of the metal lead frame or during handling of the MLP.

While the preferred embodiment of the present invention and their advantages have been disclosed in the above Detailed Description, the invention is not limited thereto but only by the spirit and scope of the appended claim.

What is claimed is:

1. A stress-free lead frame comprising;
   a plurality of integrated circuit areas, each of said plurality of integrated circuit areas having a die pad and a plurality of leads; and
   a peripheral pad surrounding said plurality of integrated circuit areas, the peripheral pad comprising first and second parallel opposing support bars and third and fourth parallel opposing support bars arranged orthogonal to the first and second opposing support bars;
   said peripheral pad being provided with a plurality of stress-relief openings alone each of the first, second, third and fourth support bars.

2. A stress-free lead frame as claimed in claim 1 wherein the peripheral pad further comprises:
   a plurality of interlocking means along the first, second, third and fourth support bars.

3. A stress-free lead frame as claimed in claim 1 wherein said plurality of stress-relief openings comprises holes and slots, each hole being a non-elongated opening and each slot being an elongated opening.

4. A stress-free lead frame as claimed in claim 3 wherein said holes and slots are arranged in multiple rows.

5. A stress-free lead frame as claimed in claim 2 wherein each of said interlocking means comprises a plurality of slots, each slot being an elongated opening.

6. A stress-free lead frame as claimed in claim 4 wherein said holes and slots are arranged side by side at equal intervals.

7. A stress-free lead frame as claimed in claim 5 wherein said holes and slots are arranged side by side at equal intervals.

8. The stress-free lead frame as claimed in claim 1 wherein the peripheral pad further comprises a plurality of positioning holes on the first and second support bars.

9. A method of manufacturing a plurality of integrated circuit packages, the method comprising:
   providing a lead frame strip comprising (i) an outer frame having a plurality of stress relief openings around a circumference of an inner portion of the outer frame and a plurality of positioning holes along an outer portion of the outer frame, and (ii) a plurality of horizontal and vertical connecting bars attached to the outer frame and arranged in a manner that defines a plurality of inner frames arranged in a matrix pattern within the outer frame, each inner frame comprising a die pad and a plurality of leads arranged around the die pad;
   placing an integrated circuit die on each die pad, and for each integrated circuit die, electrically connecting the integrated circuit die to the plurality of leads surrounding its respective die pad;
   applying encapsulant material over the lead frame strip so that the plurality of inner frames including each integrated circuit placed on each die pad within the plurality of inner frames and the plurality of stress relief openings are covered by the encapsulant material;
   severing individual integrated circuit packages from the lead frame strip to create the plurality of integrated circuit packages.

10. The method of claim 9 wherein the step of applying encapsulant material comprises heating pellets of encapsulant material placed in a mold to liquefy the material.

11. The method of claim 10 wherein the plurality of stress relief openings comprise a plurality of rows of openings.

12. The method of claim 11 wherein the plurality of rows of openings include a plurality of rows of elongated openings and at least one row of non-elongated holes.

13. The method of claim 11 wherein the plurality of rows of elongated openings comprises a first row and a second row and wherein the first row has a plurality of elongated openings that are offset from the plurality of elongated openings in the second row.

14. The method of claim 12 wherein the plurality of rows of elongated openings further comprises a third row and wherein the third row comprises a plurality of elongated openings that are substantially the same size and shape as a corresponding plurality of elongated openings in the first row.

* * * * *

UNITED STATES PATENT AND TRADEMARK OFFICE
CERTIFICATE OF CORRECTION

PATENT NO. : 6,867,483 B2
APPLICATION NO. : 09/909934
DATED : March 15, 2005
INVENTOR(S) : Huat et al.

It is certified that error appears in the above-identified patent and that said Letters Patent is hereby corrected as shown below:

Column 4: Claims 1-14 should read as follows:

1. A ~~stress-free~~ lead frame comprising;
    a plurality of integrated circuit areas, each of said plurality of integrated circuit areas having a die pad and a plurality of leads; and
    a peripheral pad surrounding said plurality of integrated circuit areas, the peripheral pad comprising first and second parallel opposing support bars and third and fourth parallel opposing support bars arranged orthogonal to the first and second opposing support bars;
    said peripheral pad being provided with a plurality of stress-relief openings alone each of the first, second, third and fourth support bars.

2. A ~~stress-free~~ lead frame as claimed in claim 1 wherein the peripheral pad further comprises:
    a plurality of interlocking means along the first, second, third and fourth support bars.

3. A ~~stress-free~~ lead frame as claimed in claim 1 wherein said plurality of stress-relief openings comprises holes and slots, each hole being a non-elongated opening and each slot being an elongated opening.

4. A ~~stress-free~~ lead frame as claimed in claim 3 wherein said holes and slots are arranged in multiple rows.

5. A ~~stress-free~~ lead frame as claimed in claim 2 wherein each of said interlocking means comprises a plurality of slots, each slot being an elongated opening.

6. A ~~stress-free~~ lead frame as claimed in claim 4 wherein said holes and slots are arranged side by side at equal intervals.

7. A ~~stress-free~~ lead frame as claimed in claim 5 wherein said holes and slots are arranged side by side at equal intervals.

8. The ~~stress-free~~ lead frame as claimed in claim 1 wherein the peripheral pad further comprises a plurality of positioning holes on the first and second support bars.

<u>9. A lead frame strip for use in making an integrated circuit die package, the lead frame strip comprising:</u>
    <u>an outer frame having a plurality of elongated stress relief openings around the circumference of the outer frame;</u>
    <u>a plurality of horizontal and vertical connecting bars attached to the other frame</u>

UNITED STATES PATENT AND TRADEMARK OFFICE
CERTIFICATE OF CORRECTION

| | | |
|---|---|---|
| PATENT NO. | : 6,867,483 B2 | |
| APPLICATION NO. | : 09/909934 | |
| DATED | : March 15, 2005 | |
| INVENTOR(S) | : Huat et al. | |

It is certified that error appears in the above-identified patent and that said Letters Patent is hereby corrected as shown below:

and defining a plurality of inner frames arranged in a matrix pattern within the outer frame, each inner frame comprising a die pad and a plurality of tabs arranged around the die pad.

10. The lead frame of claim 9 wherein the outer frame further comprises a plurality of non-elongated holes around the circumference of the outer frame.

11. The lead frame of claim 9 wherein the outer frame comprises a plurality of rows of elongated openings around the circumference of the outer frame.

12. The lead frame of claim 11 wherein the outer frame further comprises a plurality of non-elongated holes around the circumference of the outer frame, the non-elongated holes being arranged in a row distinct from the plurality of rows of elongated openings.

13. The lead frame of claim 11 wherein the plurality of elongated openings in at least one of the plurality of rows of elongated openings are regularly spaced along each portion of the outer frame.

14. The lead frame of claim 11 wherein the outer frame comprises at least three rows of elongated openings around the circumference of the outer frame.

Column 4, line 60, after claim 14 insert claims 15-37:

15. The lead frame of claim 14 wherein the three rows of elongated openings comprise a first row, a second row and a third row between the first and second rows, and wherein the first row has a plurality of elongated openings that are substantially the same size and shape as a corresponding plurality of elongated openings in the second row.

16. The lead frame of claim 15 wherein the third row comprises a plurality of elongated openings offset from the plurality of elongated openings in the first and second rows such that it is possible to draw a line orthogonal to the plurality of rows that intersects one of the elongated openings of the third row without intersecting an elongated opening in the first or second rows adjacent to the third row.

17. The lead frame of claim 16 wherein the outer frame further comprises a plurality of non-elongated holes around the circumference of the outer frame, the non-elongated holes being arranged in a row between the first and second rows of elongated openings.

UNITED STATES PATENT AND TRADEMARK OFFICE
CERTIFICATE OF CORRECTION

| | |
|---|---|
| PATENT NO. | : 6,867,483 B2 |
| APPLICATION NO. | : 09/909934 |
| DATED | : March 15, 2005 |
| INVENTOR(S) | : Huat et al. |

It is certified that error appears in the above-identified patent and that said Letters Patent is hereby corrected as shown below:

18. The lead frame of claim 17 wherein the plurality of non-elongated holes are offset from the plurality of elongated openings in the first and second rows such that it is possible to draw a line orthogonal to the plurality of rows that intersects one of the holes without intersecting an elongated opening in the first or second rows adjacent to the third row.

19. The lead frame of claim 9 wherein the outer frame further comprises a plurality of positioning holes located outside the plurality of rows of elongated openings.

20. The lead frame of claim 9 wherein the outer frame has a rectangular shape.

21. A lead frame strip for use in making an integrated circuit die package, the lead frame strip comprising:
an outer frame having a plurality of stress relief openings around the circumference of an inner portion of the outer frame and a plurality of positioning holes along an outer portion of the outer frame;
a plurality of horizontal and vertical connecting bars attached to the outer frame and defining a plurality of inner frames arranged in a matrix pattern within the outer frame, each inner frame comprising a die pad and a plurality of tabs arranged around the die pad.

22. The lead frame strip of claim 21 wherein the plurality of stress relief openings comprise a plurality of rows of openings.

23. The lead frame strip of claim 22 wherein the plurality of rows of openings comprise at least one row comprising a plurality of elongated openings.

24. The lead frame strip of claim 23 wherein the plurality of elongated openings comprise a plurality of regularly spaced elongated openings.

25. The lead frame strip of claim 23 wherein the plurality of rows of openings comprise at least one row comprising a plurality of non-elongated holes.

26. The lead frame strip of claim 25 wherein the plurality of non-elongated holes comprise a plurality of regularly spaced non-elongated holes.

27. The lead frame strip of claim 21 wherein the plurality of stress relief openings comprise a plurality of rows of elongated openings and at least one row of non-elongated holes.

UNITED STATES PATENT AND TRADEMARK OFFICE
CERTIFICATE OF CORRECTION

| | |
|---|---|
| PATENT NO. | : 6,867,483 B2 |
| APPLICATION NO. | : 09/909934 |
| DATED | : March 15, 2005 |
| INVENTOR(S) | : Huat et al. |

It is certified that error appears in the above-identified patent and that said Letters Patent is hereby corrected as shown below:

<u>28. The lead frame strip of claim 27 wherein the plurality of rows of elongated openings comprises a first row and a second row and wherein the first row has a plurality of elongated openings that are offset from the plurality of elongated openings in the second row.</u>

<u>29. The lead frame strip of claim 27 wherein the plurality of rows of elongated openings further comprises a third row and wherein the third row comprises a plurality of elongated openings that are substantially the same size and shape as a corresponding plurality of elongated openings in the first row.</u>

<u>30. The lead frame strip of claim 21 wherein the plurality of stress relief openings comprise at least row of elongated openings that are elongated in the direction of the row.</u>

<u>31. The lead frame strip of any one of claims 21-30 further comprising encapsulant covering the die pad and plurality of tabs within each of the plurality of inner frames and covering the plurality of stress relief openings around the circumference of the inner portion of the outer frame.</u>

[[9]]<u>32</u>. A method of manufacturing a plurality of integrated circuit packages, the method comprising:
   providing a lead frame strip comprising (i) an outer frame having a plurality of stress relief openings around a circumference of an inner portion of the outer frame and a plurality of positioning holes along an outer portion of the outer frame, and (ii) a plurality of horizontal and vertical connecting bars attached to the outer frame and arranged in a manner that defines a plurality of inner frames arranged in a matrix pattern within the outer frame, each inner frame comprising a die pad and a plurality of leads arranged around the die pad;
   placing an integrated circuit die on each die pad, and for each integrated circuit die, electrically connecting the integrated circuit die to the plurality of leads surrounding its respective die pad;
   applying encapsulant material over the lead frame strip so that the plurality of inner frames including each integrated circuit placed on each die pad within the plurality of inner frames and the plurality of stress relief openings are covered by the encapsulant material;
   severing individual integrated circuit packages from the lead frame strip to create the plurality of integrated circuit packages.

UNITED STATES PATENT AND TRADEMARK OFFICE
CERTIFICATE OF CORRECTION

PATENT NO. : 6,867,483 B2  Page 5 of 5
APPLICATION NO. : 09/909934
DATED : March 15, 2005
INVENTOR(S) : Huat et al.

It is certified that error appears in the above-identified patent and that said Letters Patent is hereby corrected as shown below:

[[10]]33. The method of claim [[9]]32 wherein the step of applying encapsulant material comprises heating pellets of encapsulant material placed in a mold to liquefy the material.

[[11]]34. The method of claim [[10]]33 wherein the plurality of stress relief openings comprise a plurality of rows of openings.

[[12]]35. The method of claim [[11]]34 wherein the plurality of rows of openings include a plurality of rows of elongated openings and at least one row of non-elongated holes.

[[13]]36. The method of claim [[11]]34 wherein the plurality of rows of elongated openings comprises a first row and a second row and wherein the first row has a plurality of elongated openings that are offset from the plurality of elongated openings in the second row.

[[14]]37. The method of claim [[12]]35 wherein the plurality of rows of elongated openings further comprises a third row and wherein the third row comprises a plurality of elongated openings that are substantially the same size and shape as a corresponding plurality of elongated openings in the first row.

Signed and Sealed this

Twenty-second Day of July, 2008

JON W. DUDAS
*Director of the United States Patent and Trademark Office*